SEMICONDUCTOR DEVICE AND METHOD OF MANUFACTURE

Filed March 14, 1955

INVENTOR
Edmond D. Jackson
BY Stevens, Davis, Miller and Mosher
ATTORNEYS

United States Patent Office 2,840,770
Patented June 24, 1958

2,840,770

SEMICONDUCTOR DEVICE AND METHOD OF MANUFACTURE

Edmond D. Jackson, Dallas, Tex., assignor to Texas Instruments Incorporated, Dallas, Tex., a corporation of Delaware Application March 14, 1955, Serial No. 494,129

8 Claims. (Cl. 317—240)

This invention relates to semiconductor devices and to a method for their manufacture. More specifically, this invention relates to silicon junction diodes with low resistance contacts and to an improved method of attaching ohmic and rectifying contacts to silicon to provide thereby silicon junction diodes.

Although the silicon junction diode is a comparatively recent development in the art of semiconductor diodes, it is well-known that junction diodes constructed from silicon have several advantages over diodes constructed from germanium. In the first place, the resistance to current flow in the reverse direction is many times higher in a silicon junction diode than in a germanium diode at room temperature, the rectification ratio between current flow in the forward direction and current flow in the reverse direction being in the order of $10^8$ for a silicon junction diode and $10^4$ for a germanium diode. As a second advantage, this resistance of silicon junction diodes to the flow of current in the reverse direction remains considerably higher at high temperatures than the resistance of germanium diodes to reverse current flow at the same high temperatures.

A further advantage of silicon over germanium for use in diodes appears from what is known as the Zener characteristic of p-n junctions. This characteristic is that, if the reverse voltage applied across a p-n junction is gradually increased, a point is reached where the voltage, known as the Zener voltage, is high enough to break down covalent bonds in the semiconductor lattice structure and cause large currents to flow. In a silicon junction diode, the Zener characteristic is such that as the reverse voltage applied to the diode is increased, very little current flows in the reverse direction until the breakdown point or Zener voltage is reached, at which point the dynamic resistance of the diode is reduced to a very low value. However, in a germanium diode, the Zener characteristic is such that there is a gradual increase in current flow in the reverse direction as the reverse voltage is increased until some point is reached where there is no further decrease in its dynamic resistance with increased reverse voltage. This difference between the very sharp breakdown characteristic of a silicon diode and the gradual breakdown characteristic of a germanium diode is even more pronounced as the temperature of the diodes increases.

Although silicon diodes offer many advantages over germanium diodes, the silicon diodes of the prior art have not been altogether satisfactory for several reasons. One of the main reasons for this has been the materials used in making ohmic contact to silicon. The practice heretofore has been to make the ohmic contact to silicon with a plain gold wire or a gold wire or tab doped with a donor or an acceptor impurity, the impurity type of the ohmic contact, of course, corresponding to the n-type or p-type conductivity of the silicon. These gold wires or tabs, either plain or in the impurity alloyed state, provide a fairly high resistance contact with the silicon semiconductor material and, in addition, have a non-linear resistance characteristic whereby the current through the wires does not increase linearly with increases in voltage. Since, in theory, the ideal diode would have a zero resistance to current flow in the forward direction, it can be seen that the use of either plain or alloyed impurity gold is not altogether suitable for producing silicon diodes with low resistance forward current characteristics.

Another reason for the unsatisfactory silicon diodes of the prior art is found in the practice of attaching leads separately to the rectifying junction of the diodes. The prior art method has been first to fuse or evaporate onto the silicon a gold alloy of an impurity type opposite to that of the silicon in order to make the rectifying p-n junction and then to attach a lead to the rectifying junction by means of some metallic bonding material. Not only does this complicate the production of silicon diodes and increase the cost, but the leads are not always adequately bonded to the rectifying junction.

According to the present invention, it has been found that silver, when fused to silicon of either p-type or n-type impurity, provides a low resistance contact and has a substantially linear resistance characteristic so that current through the silver lead increases approximately linearly with increases in voltage. In addition to forming an ohmic contact to silicon, ohmic being defined to mean low resistance, it has been found that silver lends itself advantageously to an improved method of producing diodes because of its high temperature of fusion with silicon. Thus, in manufacturing silicon diodes according to the method of this invention, the silver ohmic contact is first fused into the silicon material at a high temperature and some other suitable material forming an integral rectifying contact and lead can then be fused to the silicon at a lower temperature without damaging or loosening the silver ohmic contact. When the silicon is of n-type impurity, the preferred material for providing the integral rectifying contact and lead is aluminum because it is a p-type material and forms a high back resistance rectifying junction when fused into n-type silicon. The use of aluminum fused into n-type silicon has been disclosed by Morton E. Jones and Willis A. Adcock in United States patent application Serial No. 428,472, filed May 10, 1954.

Accordingly, it is the principal object of this invention to disclose the use of silver generally as an ohmic contact for semiconductor devices and particularly as an ohmic contact for silicon junction diode semiconductor devices.

It is another principal object to disclose an improved method of attaching ohmic and rectifying contacts to silicon providing thereby a simplified, inexpensive, and effective method of manufacturing silicon junction diodes.

The above objects will be clarified and other objects made known from the following description when taken in conjunction with the drawings in which.

Figure 2:
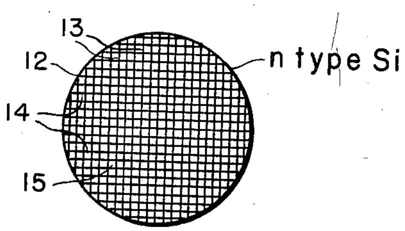
Figure 2 is a plan view of a transverse section cut from the crystal of Figure 1 with lines indicating how it is to be further sectioned into small squares.
Figure 3:
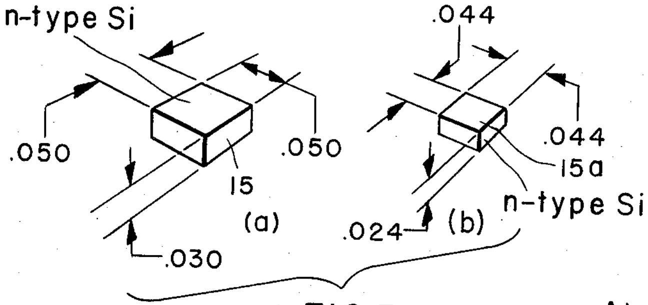
Figure 4:
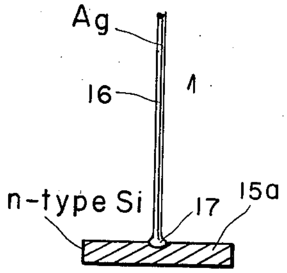
Figure 5:
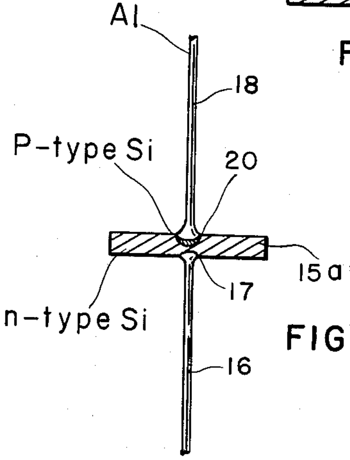
Figure 6:
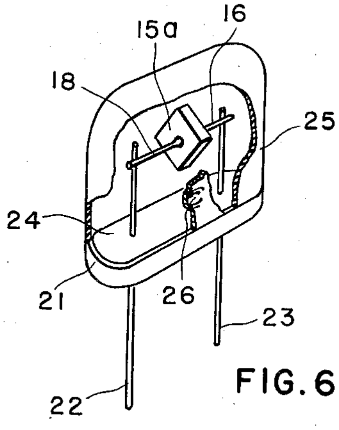

Figure 3*a* is a perspective view before etching of a small square produced by sectioning the transverse section of Figure 2;

Figure 3*b* is a similar view showing the relative size of the square of Figure 3*a* after etching;

Figure 4 is a side sectional view of a crystal section with an ohmic contact fused to the etched square of Figure 3*b*;

Figure 5 is a similar view of the same construction with a rectifying contact and junction produced by fusing a suitable material into the opposite side of the crystal section from that to which the ohmic contact is attached; and Figure 6 is a cutaway view in perspective illustrating the diode of Figure 5 attached to a header support and protected by a cover extending over the completed assembly.

Figure 1:
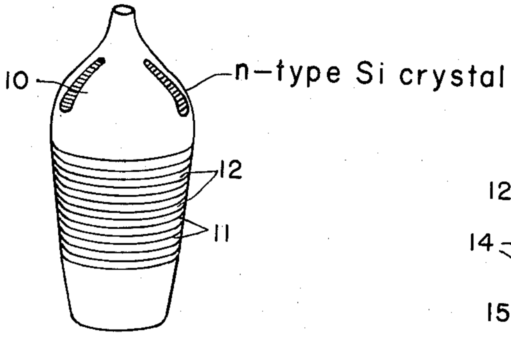
Figure 1 is a perspective view of a grown crystal of n-type conductivity with a series of transverse lines indicating the manner in which the crystal is cut into sections.

Referring now to the drawings, the first step in producing silicon diodes as shown in Figure 1 consists of growing a single large silicon crystal 10 in a crystal puller not shown but well-known in the art. For the purpose of illustrating the preferred embodiment of this invention, the crystal 10 is designated as a silicon crystal of n-type impurity. In producing the n-type crystal 10, a quantity of approximately 50 grams of silicon is placed in the crystal puller, heated to its melting point and then doped to the desired concentration by the addition of an element from the fifth group of the periodic table of elements. It has been found that an n-type crystal with the desired properties can be produced by the addition of antimony in the ranges of about 0.5 to $2.0\times10^{-7}$ antimony atoms per silicon atom. Next, a seed with a single crystalline structure is inserted into the molten silicon and slowly withdrawn as the crystal puller rotates. As the seed is withdrawn, the silicon in the melt grows on the seed crystal with the same crystalline structure as that of the seed and solidifies above the level of the molten material, thus forming the n-type silicon crystal 10. Crystal 10 is sliced into a series of transverse sections each with a thickness of approximately .030″. The series of parallel lines 11 indicate the manner in which the crystal 10 of Figure 1 is cut to produce transverse sections 12.

As shown in Figure 2, each of the transverse sections 12 is first cut along the parallel lines 13 to produce a number of parallel strips of any desired width. Maintaining the strips in parallel relationship, the section is then turned 90° and cut along the parallel lines 14 which results in a large number of squares 15. Although the transverse section may be cut and diced into squares of any desired side dimensions and thickness, the process described and illustrated herein produces squares with side dimensions of .050″ and a thickness of .030″ as indicated in Figure 3*a*. Since the single crystalline structure of the surface of the squares is somewhat damaged in the cutting process, the squares 15 are restored to their single crystalline structure by etching about .003″ from each cut face. After the etching process, a square **15*a*** results which has side dimensions of approximately .044″ and a thickness of approximately .024″ as illustrated in Figure 3*b*. It should be recognized at this point that the silicon material used in the production of diodes need not be in the form of squares since the silicon may be in any other suitable shape such as a sphere.

The next step in the process of producing silicon diodes consists of attaching the ohmic contact to the etched square **15*a*. It has been found that a silver wire is much more satisfactory than the prior art gold or gold doped wire for the ohmic contact because it not only provides a much lower resistance but has a substantially linear resistance characteristic to current flow as well. To fuse the silver wire 16 into square 15*a* as shown in Figure 4, the square is placed in a furnace with a helium or other inert gas atmosphere or in a vacuum and heated to approximately 830° C., the temperature at which silver and silicon form a molten eutectic mixture. Then, silver wire 16 is brought into contact with the square 15*a* at this temperature and cooled to form fused connection 17 with square 15*a***. It should be recognized that such a silver ohmic contact is not limited to use in a silicon diode since it exhibits the same ohmic and linear resistance properties when used as a contact for germanium diodes, or for that matter, germanium and silicon transistors.

To complete the silicon diode, square **15*a*, with the silver wire 16 attached as shown in Figure 4, is inverted and again placed in a furnace and heated in a helium atmosphere. An aluminum wire 18 is placed in contact with the square 15*a* on the opposite side from the silver wire 16 and the temperature brought up to about 577° C. At this temperature, the end of the aluminum wire forms a molten eutectic mixture with the silicon adjacent to the tip of wire 18 whereupon the heating is stopped and the junction allowed to solidify. It has been found that during the heating operation, enough aluminum mixes with the n-type silicon material to convert the part of the n-type immediately under the end of the wire into p-type material which, on cooling, recrysallizes out and forms a p-n rectifying junction 19. After it has cooled, the connection area is etched as at 20** to remove any material that might possibly connect the aluminum wire directly with the n-type silicon and, therefore, avoid the possibility of a short-circuit connection around the junction.

As can be seen from the successive views of Figures 4 and 5, the silver wire is attached first and the aluminum attached afterwards. This follows from the eutectic temperatures of silver-silicon and aluminum-silicon since the silver connection requires a temperature of 830° C. in comparison with the aluminum connection temperature of 577° C. Thus, the silver wire can be attached to the silicon wafer first and not be damaged in the process of fusing the aluminum wire to the silicon square. After the wires 16 and 18 have been attached to the square **15*a*, the diode is then completed as shown in Figure 6. A header 21 supports the leads 22 and 23 in a sealed and insulated relationship by means of the glass material 24. The diode of Figure 5 is attached to the header assembly by welding rectifying contact 18 to lead 22 and ohmic contact 16 to lead 23. A protective material is placed around the diode, if desired, and the header can 25 placed over the completed assembly and soldered to header 21 providing a sealing and protective cover for the diode. To distinguish the rectifying and ohmic contact sides of the junction when header cover 25 is in place, indentation 26 is provided in only one side of cover 25** thus permitting the diode to be properly oriented for connection into an electrical circuit.

While the silicon diode of this invention has been described in a specific embodiment, numerous modifications in the details of this invention will immediately be apparent to those skilled in the art. Consequently, it is intended to include within the scope of this description and the definition of the appended claims all such modifications.

What is claimed is:

1. A semiconductor diode comprising a wafer of silicon of one type conductivity, and fused thereto at spaced intervals a silver wire connector for forming an ohmic contact with said wafer and a wire connector producing an opposite type conductivity in said silicon for forming a rectifying p-n junction with said wafer.

2. A semiconductor diode comprising a wafer of n-type silicon and, fused thereto at spaced intervals, a silver wire connector for forming an ohmic contact with said wafer and an aluminum wire for forming a rectifying p-n junction with said wafer.

3. A semiconductor diode comprising a wafer of n-type silicon and, fused on opposite sides thereof, a silver wire connector for forming an ohmic contact with said wafer and an aluminum wire for forming a rectifying p-n junction with said wafer.

4. A method of making semiconductor diodes comprising heating a wafer of silicon of one conductivity type to the silicon-silver eutectic temperature, bringing a silver wire into contact with a surface of said wafer while at the eutectic temperature, cooling said wafer to form a fused connection of said silver wire therewith, thereafter heating said wafer and silver wire to the eutectic temperature of the silicon and a material producing an opposite type conductivity which temperature is below the silicon-silver eutectic temperature, bringing a wire connector of said material producing an opposite type conductivity into contact with said wafer while at the eutectic temperature at a point spaced from said silver wire connector and cooling said wafer to form a fused wire connection to said silicon, said latter connection forming a p-n junction therewith.

5. A method of making semiconductor diodes comprising heating a wafer of n-type silicon to the silicon-silver eutectic temperature, bringing a silver wire into contact with a surface of said wafer while at the eutectic temperature, cooling said wafer to form a fused connection of said silver wire therewith, thereafter heating said wafer and silver wire to the silicon-aluminum eutectic temperature, bringing an aluminum wire into contact with said wafer while at the eutectic temperature and at a point spaced from said silver wire connector, and cooling said wafer to form a fused wire connection to said silicon, said latter connection forming a p-n junction therewith.

6. A method of making semiconductor diodes as defined in claim 5 wherein said silicon-silver eutectic temperature is approximately 830° C. and the silicon-aluminum eutectic temperature is approximately 577° C.

7. A method of producing semiconductor diodes as defined in claim 6 wherein said heating steps are conducted in an inert gas atmosphere.

8. A method as defined in claim 6 wherein said heating steps are conducted in a vacuum.

References Cited in the file of this patent

UNITED STATES PATENTS

| | | |
|---|---|---|
| 2,680,220 | Starr et al. | June 1, 1954 |
| 2,684,457 | Lingel | July 20, 1954 |
| 2,695,852 | Sparks | Nov. 30, 1954 |